(12) United States Patent
Ryan et al.

(10) Patent No.: US 9,076,846 B2
(45) Date of Patent: Jul. 7, 2015

(54) METHODS FOR FABRICATING INTEGRATED CIRCUITS USING SURFACE MODIFICATION TO SELECTIVELY INHIBIT ETCHING

(71) Applicant: GLOBALFOUNDRIES, Inc., Grand Cayman, KY (US)

(72) Inventors: Errol Todd Ryan, Clifton Park, NY (US); Kunaljeet Tanwar, Slingerlands, NY (US); Xunyuan Zhang, Albany, NY (US)

(73) Assignee: GLOBALFOUNDRIES, INC., Grand Cayman (KY)

( * ) Notice: Subject to any disclaimer, the term of this patent is extended or adjusted under 35 U.S.C. 154(b) by 57 days.

(21) Appl. No.: 14/071,070

(22) Filed: Nov. 4, 2013

(65) Prior Publication Data
US 2015/0126028 A1    May 7, 2015

(51) Int. Cl.
*H01L 21/44* (2006.01)
*H01L 21/768* (2006.01)

(52) U.S. Cl.
CPC ................................. *H01L 21/76841* (2013.01)

(58) Field of Classification Search
CPC ................. H01L 21/76838; H01L 21/768384; H01L 21/76841; H01L 21/76843; H01L 21/76846

USPC ......... 438/625, 626, 627, 637, 643, 645, 653, 438/675, 687
See application file for complete search history.

(56) References Cited

U.S. PATENT DOCUMENTS

| 6,673,695 B1 * | 1/2004 | Lim et al. ...................... 438/424 |
| 7,288,487 B1 * | 10/2007 | Kang et al. .................... 438/723 |
| 7,605,082 B1 * | 10/2009 | Reid et al. ..................... 438/678 |
| 2003/0111735 A1 * | 6/2003 | Lee ................................ 257/774 |
| 2009/0280649 A1 * | 11/2009 | Mayer et al. .................. 438/676 |

FOREIGN PATENT DOCUMENTS

EP      2087061 B1    8/2012

* cited by examiner

*Primary Examiner* — Kevin M Picardat
(74) *Attorney, Agent, or Firm* — Ingrassia Fisher & Lorenz, P.C.

(57) ABSTRACT

Methods for fabricating integrated circuits are provided in various exemplary embodiments. In one embodiment, a method for fabricating an integrated circuit includes providing a semiconductor substrate having a first exposed surface including an elemental metal material and a second exposed surface including a barrier material. The elemental metal material has a first etch rate when exposed to a wet etchant and the barrier material has a second etch rate when exposed to the wet etchant. Further, the method includes modifying the first exposed surface to form a modified first exposed surface so as to reduce the first etch rate when exposed to the wet etchant and applying the wet etchant simultaneously to the modified first exposed surface and to the second exposed surface.

20 Claims, 8 Drawing Sheets

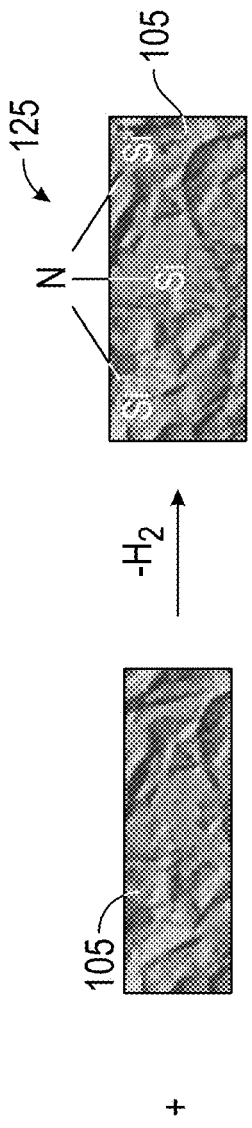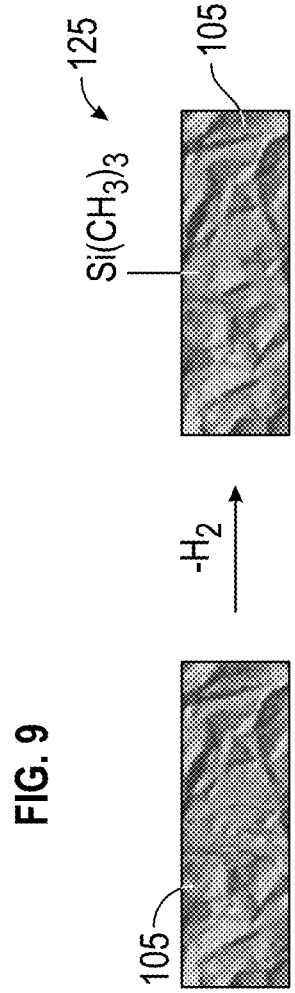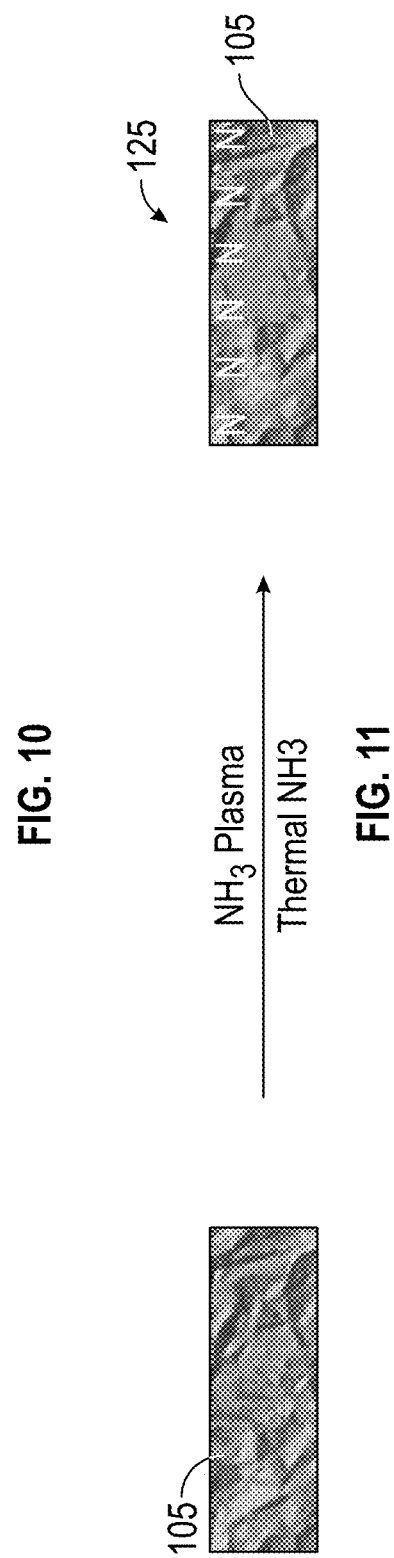

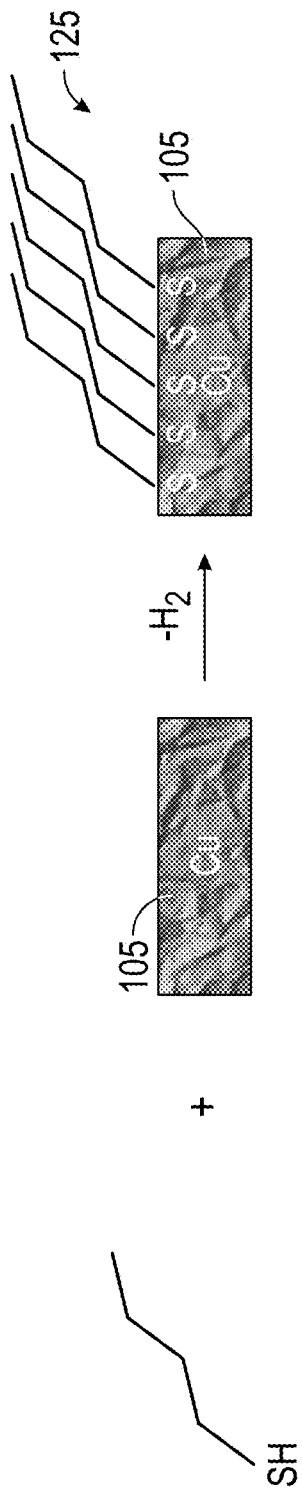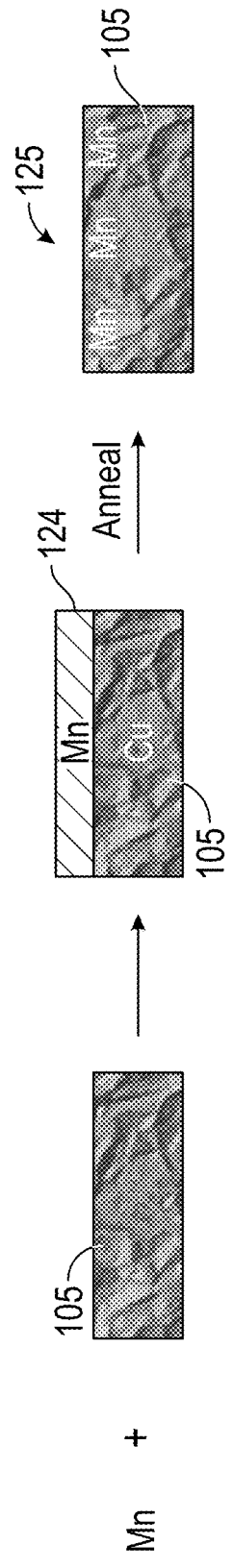

US 9,076,846 B2

METHODS FOR FABRICATING INTEGRATED CIRCUITS USING SURFACE MODIFICATION TO SELECTIVELY INHIBIT ETCHING

TECHNICAL FIELD

The present disclosure generally relates to methods for fabricating integrated circuits. More particularly, the presented disclosure relates to methods for surface modification to selectively inhibit etching in the fabrication of integrated circuits.

BACKGROUND

The majority of present day integrated circuits (ICs) are implemented by using a plurality of interconnected field effect transistors (FETs), also called metal oxide semiconductor field effect transistors (MOSFETs), or simply MOS transistors. An MOS transistor includes a gate electrode as a control electrode formed over a semiconductive substrate, and spaced apart source and drain electrodes within the substrate between which a current can flow. A control voltage applied to the gate electrode controls the flow of current through a channel in the semiconductive substrate between the source and drain electrodes. Dielectric materials, such as silicon dioxide, are commonly employed to electrically separate the various gate electrodes in the IC.

One problem with the silicon dioxide-based dielectric materials, however, is that their dielectric constant is relatively high, being approximately 3.9 or higher, depending on factors such as residual moisture content. As a result, the capacitance between the conductive layers in the IC is also relatively high, which in turn limits the speed (frequency) at which a circuit can operate. Strategies being developed to increase the frequency at which the circuit can operate include (1) incorporating metals with lower resistivity values (e.g., copper), and (2) providing electrical isolation with insulating materials having lower dielectric constants relative to silicon dioxide.

One way to fabricate copper structures, such as planar copper circuit paths (or "traces"), on a dielectric substrate is referred to as the "damascene" process. In accordance with this process, the silicon dioxide dielectric surface is patterned by a conventional dry etch process to form holes (i.e., vias) and trenches for vertical and horizontal interconnects prior to deposition of copper onto the surface. Copper has the property of being a fast diffuser during the thermal cycling that a semiconductor substrate experiences during the fabrication process, as well as during actual device operation under applied electric fields, and can move quickly through the underlying dielectric layer and overlying interlevel dielectric (ILD) layers to "poison" the device. Copper diffusion through the substrate dielectric material results in current leakage between adjacent metal lines, leading to degraded device characteristics and, potentially, non-functioning devices. Thus, a diffusion barrier layer is typically deposited in vias and trenches before the deposition of copper. The diffusion barrier layer is provided with a copper seed layer and then over-coated with a copper layer from a copper plating bath. Chemical-mechanical polishing is employed to reduce the thickness of the copper overburden outside the vias and trenches, as well as the thickness of the diffusion barrier layer, until a planar surface that exposes elevated portions of the dielectric surface is obtained. The vias and trenches remain filled with electrically conductive copper forming the circuit interconnects.

Tantalum and tantalum nitride have found wide acceptance in the industry as barrier layer materials and are typically deposited by physical vapor deposition (PVD). However, as the lines defining circuits are being reduced in size, one concern is to avoid degrading the current carrying capacity of the copper lines. As the dimensions of copper lines are reduced, electron scattering from the lines becomes significant and causes an increase in resistivity. One solution is to reduce the thickness of the barrier layer and thereby allow for a proportionately thicker copper line within a given trench by using an atomic layer deposited (ALD) barrier layer. A copper seed layer is then applied by a conventional PVD process. However, formation of the copper seed layer is complicated by the need to provide a precise thickness of the layer to avoid overhang at the top of trenches with overly thick layers and to avoid copper oxidation by atmospheric oxygen occurring with overly thin layers.

One proposed solution is to plate copper directly onto a diffusion barrier layer. Ruthenium, in particular, has shown promise in this application. The electrical conductivity of ruthenium allows for direct plating of copper onto the ruthenium, which obviates the need for a copper seed layer. Although the possibility of replacing tantalum/tantalum nitride barriers layers with ruthenium remains an attractive possibility, the likely course of development appears to lie with a copper-ruthenium-tantalum/tantalum nitride system.

FIG. 1 is illustrative of such a system. As shown, a dielectric material layer 101, such as a layer of organosilicate glass (also called carbon-doped oxide or SiCOH), has a trench and/or via 110 formed therein. As noted above, the via 110 may be formed by patterning and etching the dielectric layer 101. A hardmask layer 102 is used to protect areas of the dielectric layer that are not etched. A layer of a first diffusion barrier material 103, such as tantalum or tantalum nitride, is deposited within the via 110 and over the hardmask layer 102. A layer of a second diffusion barrier material 104, which also has compatibility for the direct plating of copper thereto, such as ruthenium, is deposited over the first diffusion barrier material 103. Subsequently, a copper interconnect 105 is plated over the second diffusion barrier material 104 and within the via 110.

After the plating of the copper interconnect, it is typically necessary to polish or etch the substrate so as to planarize the diffusion barrier material layers 103, 104 and the copper interconnect 105 to the level of the hardmask 102. Polishing compositions that have been developed for ruthenium and other noble metals typically contain strong oxidizing agents, have a low pH, or both. Copper tends to oxidize very rapidly in these polishing compositions. Additionally, because of the difference in standard reduction potentials of ruthenium and copper, copper suffers from galvanic attack by ruthenium in the presence of conventional ruthenium polishing compositions. The galvanic attack leads to etching of copper lines and a resulting degradation of circuit performance. Further, the wide difference in chemical reactivity of copper and ruthenium in conventional polishing compositions results in widely differing rates of removal in chemical-mechanical polishing of substrates containing both metals, which can result in overpolishing of copper during ruthenium barrier polishing.

This effect is illustrated in FIGS. 2 and 3. With reference to FIG. 2, the copper interconnect 105 may first be planarized to the level of the second diffusion barrier (ruthenium) layer 104 using convention CMP techniques. Wet etching could be employed to reduce the diffusion barrier layers 103, 104 and the copper interconnect 105 to the level of the hardmask 102, as shown in FIG. 3. However, due to the above-noted rapid oxidation of copper, the galvanic attack by ruthenium, and the difference in reactivity between the various metals of layer 103 through 105, the copper interconnect becomes over-etched, resulting in a void region 111 formed within the trench 110.

Substrates including tantalum or tantalum nitride in addition to ruthenium and copper pose additional challenges in that polishing compositions suitable for ruthenium or copper, themselves highly dissimilar materials, are typically unsuitable for the polishing of tantalum or tantalum nitride layers. Polishing compositions suitable for use in the polishing of tantalum or tantalum nitride barrier layers tend to chemically attack copper remaining in the circuit lines, which can lead to dishing of the circuit lines. Dishing of circuit lines can lead to discontinuities in the circuits and to non-planarity of the substrate surface, as shown in FIG. 3, complicating further processing steps. Successful implementation of ruthenium-copper-tantalum microelectronic technology will thus require new polishing and/or etching methods suitable for the polishing and/or etching of all three materials.

Accordingly, it is desirable to provide improved methods for fabricating integrated circuits using damascene process flows. Additionally, it is desirable to provide such methods that prevent over-etching of copper interconnects. Furthermore, other desirable features and characteristics of the present disclosure will become apparent from the subsequent detailed description and the appended claims, taken in conjunction with the accompanying drawings and the foregoing technical field and background.

BRIEF SUMMARY

Various exemplary methods for fabricating integrated circuits are provided herein. In one exemplary embodiment, a method for fabricating an integrated circuit includes providing a semiconductor substrate having a first exposed surface including an elemental metal material and a second exposed surface including a barrier material. The elemental metal material has a first etch rate when exposed to a wet etchant and the barrier material has a second etch rate when exposed to the wet etchant. Further, the method includes selectively modifying the first exposed surface to form a modified first exposed surface so as to reduce the first etch rate when exposed to the wet etchant and applying the wet etchant simultaneously to the modified first exposed surface and to the second exposed surface.

In another exemplary embodiment, providing a semiconductor substrate having a first exposed surface including an elemental copper interconnect structure disposed within a via and a second exposed surface including a ruthenium diffusion barrier material. The first exposed surface and the second exposed surface are planar with respect to one another. The elemental copper interconnect structure has a first etch rate when exposed to a wet etchant and the ruthenium diffusion barrier material has a second etch rate that is slower than the first etch rate when exposed to the wet etchant. Further, the method includes modifying the first exposed surface to form a modified first exposed surface so as to reduce the first etch rate when exposed to the wet etchant. Modifying the first exposed surface is selected from the following group: forming a protective copper silicon nitride surface-modifying protective layer on the first exposed surface, forming a methyl silane surface-modifying protective layer on the first exposed surface, forming a metal nitride surface-modifying protective layer on the first exposed surface, forming a thiol surface-modifying protective layer on the first exposed surface, and forming a second elemental metal layer on the first exposed surface. Still further, the method includes applying the wet etchant simultaneously to the modified first exposed surface and to the second exposed surface.

In yet another exemplary embodiment, a method for fabricating an integrated circuit includes providing a semiconductor substrate having a first exposed surface including an elemental cobalt capping layer disposed over a copper metal layer and a second exposed surface including a titanium hardmask barrier material. The first exposed surface and the second exposed surface are non-planar with respect to one another. The elemental cobalt capping layer has a first etch rate when exposed to a wet etchant and the titanium hardmask barrier material has a second etch rate when exposed to the wet etchant. The method further includes modifying the first exposed surface to form a modified first exposed surface so as to reduce the first etch rate when exposed to the wet etchant. Modifying the first exposed surface is selected from the following group: forming a protective copper silicon nitride surface-modifying protective layer on the first exposed surface, forming a methyl silane surface-modifying protective layer on the first exposed surface, forming a metal nitride surface-modifying protective layer on the first exposed surface, forming a thiol surface-modifying protective layer on the first exposed surface, and forming a second elemental metal layer on the first exposed surface. Still further, the method includes applying the wet etchant simultaneously to the modified first exposed surface and to the second exposed surface.

BRIEF DESCRIPTION OF THE DRAWINGS

The various embodiments will hereinafter be described in conjunction with the following drawing figures, wherein like numerals denote like elements, and wherein:

FIGS. 8-13 illustrate various surface modification methods suitable for use with the exemplary embodiments described herein;

DETAILED DESCRIPTION

The following detailed description is merely illustrative in nature and is not intended to limit the embodiments of the subject matter or the application and uses of such embodiments. Furthermore, there is no intention to be bound by any expressed or implied theory presented in the preceding technical field, background, brief summary or the following detailed description.

Figure 3:
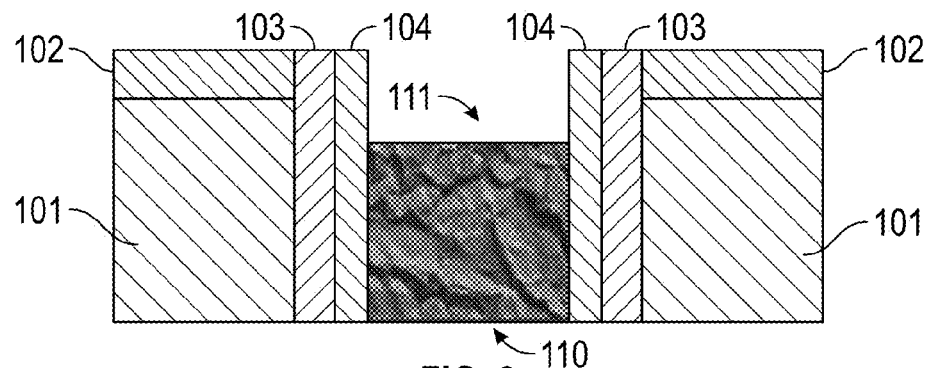

Embodiments of the present disclosure are directed to methods for fabricating integrated circuits, and in particular the embodiments described herein provide for surface modification to selectively inhibit etching in the fabrication of integrated circuits. In order to prevent the over-etching of the copper interconnects as illustrated above in FIG. 3, the presently described embodiments modify the exposed surface of copper interconnect 105 using a variety of chemical surface modification techniques, as will be described in greater detail below. The chemical modification of the exposed copper interconnect surface slows the etching of the copper during the above-described etching of the diffusion barrier layers 103, 104, thus effectively preventing over-etching of the interconnect 105.

For the sake of brevity, conventional techniques related to semiconductor device fabrication may not be described in detail herein. Moreover, the various tasks and process steps described herein may be incorporated into a more comprehensive procedure or process having additional steps or functionality not described in detail herein. In particular, various steps in the manufacture of semiconductor based transistors are well known and so, in the interest of brevity, many conventional steps will only be mentioned briefly herein or will be omitted entirely without providing the well-known process details.

Figure 1:
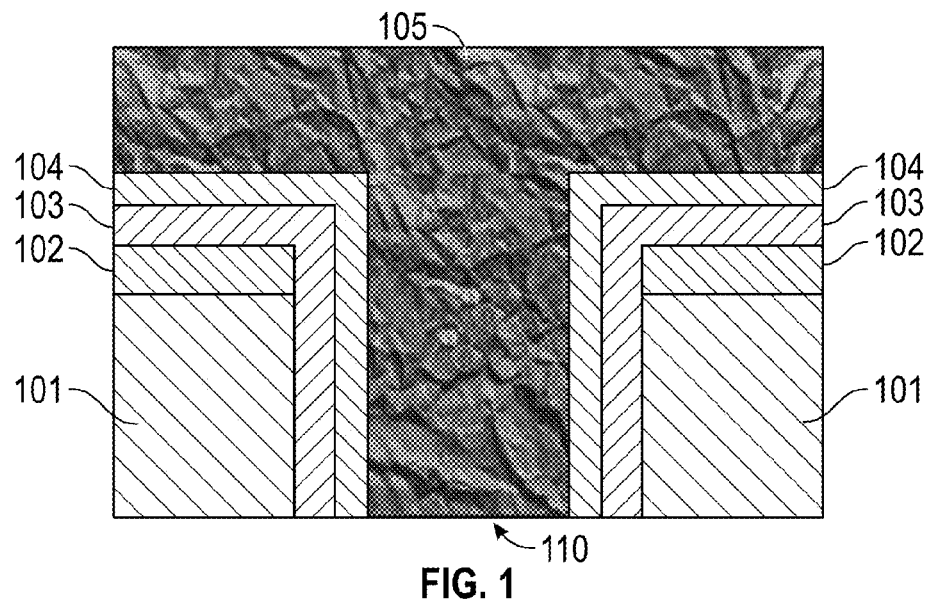
FIGS. 1-3 illustrate, in cross section, an integrated circuit structure and method for fabricating an integrated circuit in accordance with methods known in the prior art in order to demonstrate certain problems encountered in the prior art.
Figure 2:
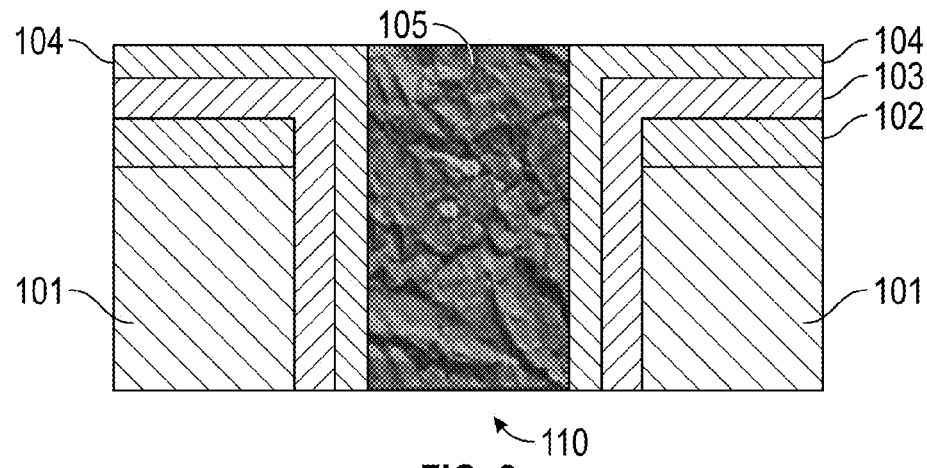
Figure 4:
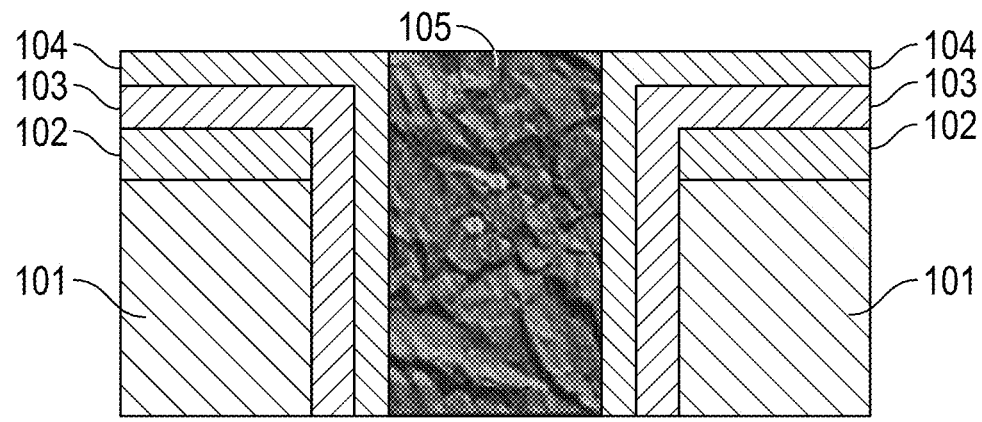
FIGS. 4-7 illustrate, in cross section, an integrated circuit structure and methods for fabricating an integrated circuit in accordance with various embodiments of the present disclosure.

In one embodiment, an exemplary integrated circuit fabrication method begins with a step of providing a semiconductor substrate including a first exposed surface including an elemental metal material and a second exposed surface including a barrier material, wherein the elemental metal material has a first etch rate when exposed to a wet etchant and the barrier material has a second etch rate when exposed to the same wet etchant. With reference to FIG. 4, illustrated is such a semiconductor substrate. The first exposed surface includes an elemental copper material as the copper interconnect 105, and the second exposed surface includes a ruthenium barrier material 104. The device illustrated in FIG. 4 corresponds to the structure described above in connection with FIG. 2, and thus the process details required to fabricate such structure will not be repeated herein.

Figure 5:
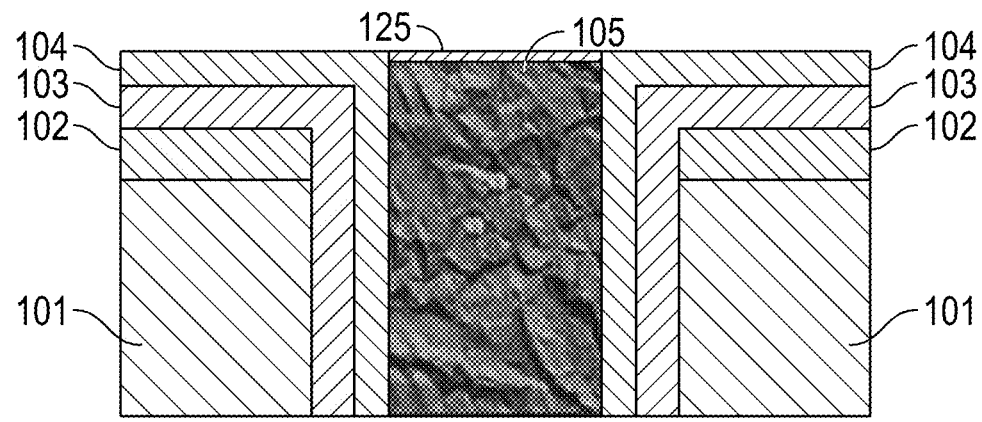

The exemplary integrated circuit fabrication method continues with a step of modifying the first exposed surface to form a modified first exposed surface so as to reduce the first etch rate when exposed to the wet etchant. As noted above, copper tends to be over-etched using etching chemistries suitable for etching barrier materials such as ruthenium, tantalum, and tantalum nitride. Thus, in order to slow the etching of the first exposed surface, that of copper interconnect 105, the first exposed surface is chemically modified, as indicated by reference numeral 125 in FIG. 5, so as to reduce the etch rate thereof when the wet etchant is applied.

Figure 8:
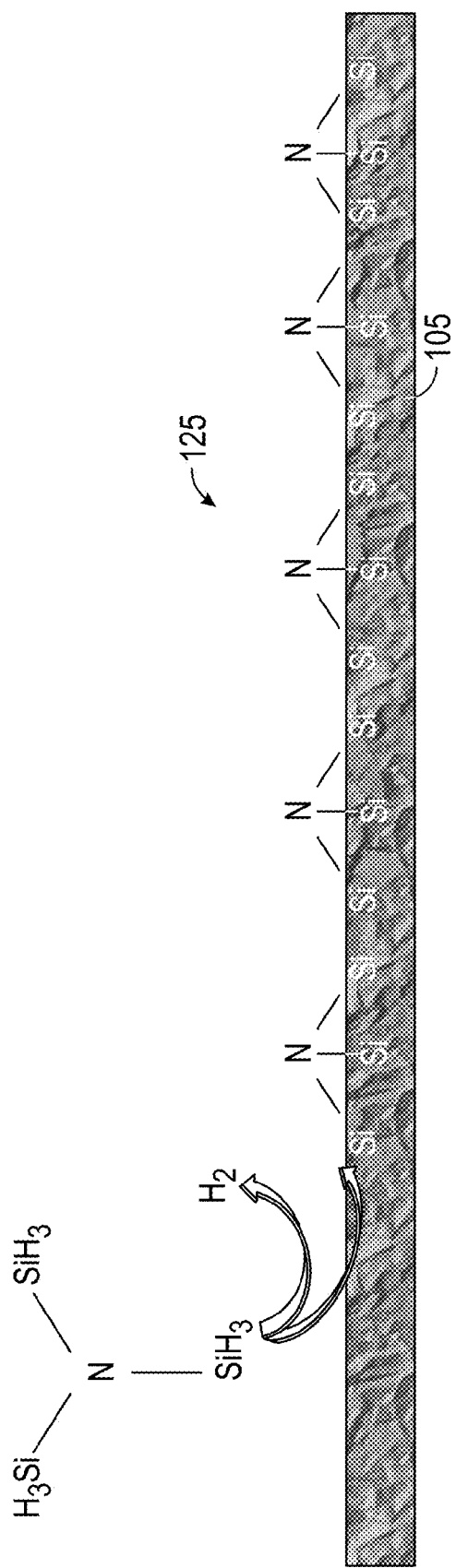

With reference now to FIGS. 8-13, various surface modification methods suitable for use with the exemplary embodiment described herein are provided. Surface modifications can be done selectively because the Ru surface is unreactive relative to the Cu surface. As shown in FIG. 8, the surface 125 may be modified by forming a protective surface-modifying protective layer on the first exposed surface. During subsequent etching processes, when the etchant is applied to the surface 125, the etchant first comes into contact with the surface-modifying protective layer, which reduces the etching rate thereof as compared to the elemental metal.

FIGS. 9-12 provide several exemplary surface-modifying protective layers that may be formed on the first exposed surface 125. Regarding FIGS. 8 and 9, the exemplary surface-modifying protective layer illustrated is a copper silicon nitride (nitride copper silicide) surface-modifying protective layer. The copper silicon nitride surface-modifying protective layer may be formed on the surface 125 by exposing the surface 125 to trisilylamine. The three silicon atoms of each trisilylamine bond with the elemental copper surface 105, releasing $H_2$ gas in the process. The nitrogen atom, bound to the three silicon atoms, is exposed at the surface. The reaction conditions for this process include, for example, exposing the surface to the trisilylamine at about 100° C. to about 400° C. for about 1 second to about 60 seconds (or any time needed to form the layer of interest).

Regarding FIG. 10, the exemplary surface-modifying protective layer illustrated is a methyl silane surface-modifying protective layer. The methyl silane surface-modifying protective layer may be formed on the surface 125 by exposing the surface 125 to trimethylsilane. Each silicon atom bonds with the elemental copper surface 105, releasing $H_2$ gas in the process. The methyl functional groups, bound to the silicon atom, are exposed at the surface. The reaction conditions for this process include, for example, exposing the surface to the trisilylamine at about 100° C. to about 400° C. for about 1 second to about 60 seconds (or any time needed to form the layer of interest).

Regarding FIG. 11, the exemplary surface-modifying protective layer illustrated is a metal nitride surface-modifying protective layer. The metal nitride surface-modifying protective layer may be formed on the surface 125 by exposing the surface 125 to an ammonia plasma. Each nitrogen atom bonds with the elemental copper surface 105, releasing $H_2$ gas in the process. The reaction conditions for this process include, for example, exposing the surface to a plasma containing $NH_3$ (for example, $NH_3/N_2$, $NH_3/He$, etc.) at 100° C. to about 400° C. for about 1 second to about 60 seconds (or any time needed to form the layer of interest).

Regarding FIG. 12, the exemplary surface-modifying protective layer illustrated is a thiol surface-modifying protective layer. The thiol surface-modifying protective layer may be formed on the surface 125 by exposing the surface 125 to an appropriate thiol compound, such as methanethiol (methyl mercaptan), ethanethiol (ethyl mercaptan), propanethiol (propyl mercaptan), butanethiol (n-butyl mercaptan, as illustrated in FIG. 12), or any other appropriate thiol compound capable of forming a surface-modifying protective layer. Each sulfur atom bonds with the elemental copper surface 105, releasing $H_2$ gas in the process. The hydrocarbon group, bound to the sulfur atom, is exposed at the surface. The reaction conditions for this process include, for example, exposing the surface to the thiol compound vapor at room temperature to about 350° C. or exposing the surface to thiol compound as a liquid. In the case of liquid thiol exposure the chemical could be used as part of the wet etch process.

In another embodiment, as illustrated in FIG. 13, surface 125 may be modified by forming a thin (i.e., less than 5 nanometers), second elemental metal layer over the first elemental layer, i.e. over the copper interconnect 105. The second elemental metal may be supplied from any suitable ionic or organic source thereof. Thereafter, the exposed surface is annealed at an elevated temperature to chemically and metallurgically bond the first elemental metal layer to the second elemental metal layer. In one exemplary embodiment, the second elemental metal may be a manganese metal, as illustrate in FIG. 13. As such, the surface becomes Mn-rich. The second elemental metal is selected so as to have an etch rate that is less than that of copper when exposed to the etchant, as described above. Using the example of manganese, the reaction conditions for forming this second metal layer include, for example, depositing a blanket Mn layer, annealing at about 100° C. to about 400° C. to form the Cu(Mn) layer, and selective removal of the excess Mn layer by wet chemicals. In an alternative embodiment, Mn may be selectively deposited using electroplating or selective chemical vapor deposition.

Figure 6:
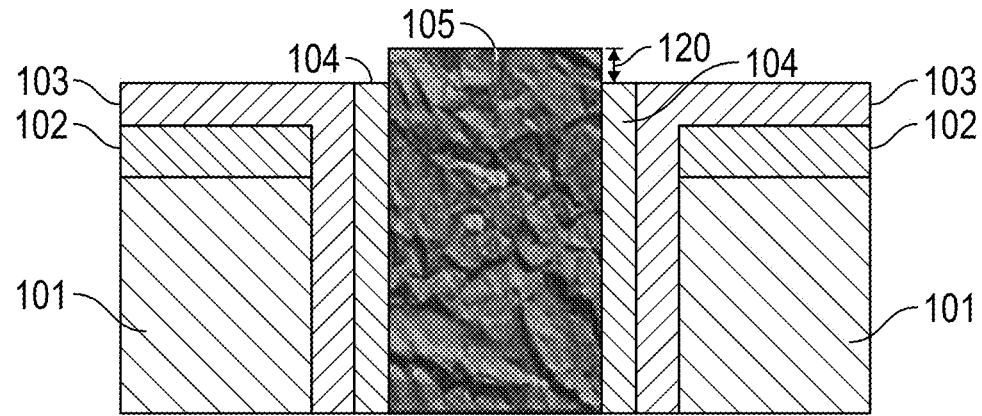
Figure 7:
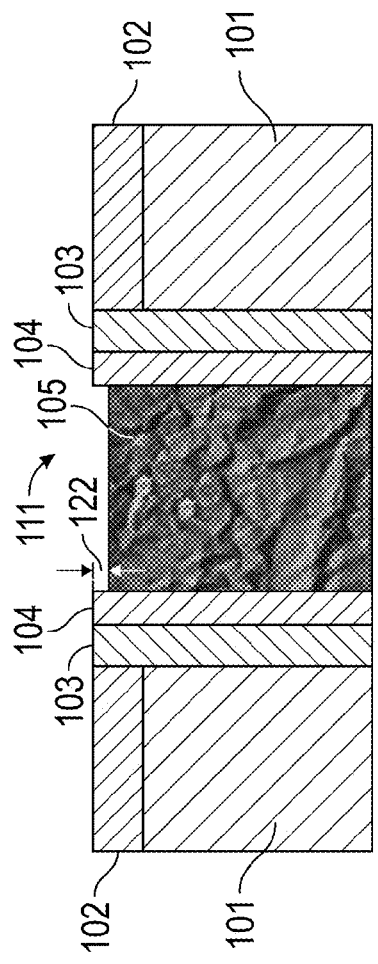

With reference back to FIG. 5, the illustrated cross-section shows the modified first surface 125, which has been modified according to any one of the techniques described above. Thereafter, with reference to FIGS. 6 and 7, the barrier material layers 103 and 104 are etched in a single or a multi-step wet etching process (a two-step etching process is shown in FIGS. 6 and 7, one step for each of layers 104 and 103, respectively; the etchants may be optimized for each of the barrier materials 104 and 103, respectively, as is known in the art). Suitable etchants for this wet etching step(s) include, for example, sodium hypochlorite at neutral or alkaline media, alkaline and oxidizer mixtures like SC1 or strong acid mixtures or acid/oxidizer mixtures. While not intending to be bound by any particular embodiment or mechanism of action, FIG. 6 shows that the modified surface 125 of the copper interconnect 105 has inhibited etching of the elemental copper material such that the interconnect extends to a distance, indicated by double-headed arrow 120, above the barrier layer 103 after the first etching step is completed. During the second etching step, after some or all of the modified surface 125 has been etched away, etching of the elemental copper is much faster, resulting in a smaller step height difference, indicated by double-headed arrow 122, (or void region 111) between the copper interconnect 105 and the surface of the now-exposed hardmask layer 102. Beneficially, the void region 111 is much smaller than in prior art methods (for example, as shown in the comparative example of FIG. 3).

Although not illustrated, with regard to any of the embodiments described above, the partially-formed integrated circuit is completed in a conventional manner by, for example, providing electrical contacts to electrical devices, depositing other interlayer dielectrics, etching contact vias, filling the contact vias with conductive plugs, and the like as are well known to those of skill in the art of fabricating integrated circuits. Additional post-processing may include the formation of further metal and interlayer dielectric layers therebetween to complete the various electrical connections in the integrated circuit. The present disclosure is not intended to exclude such further processing steps as are necessary to complete the fabrication of a functional integrated circuit, as are known in the art.

Figure 14:
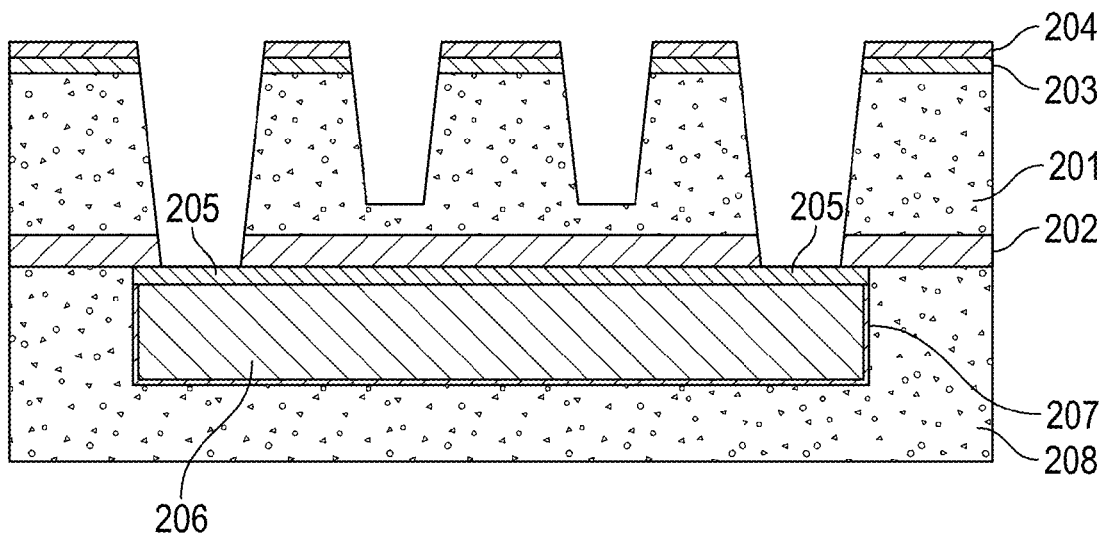
FIGS. 14 and 15 illustrate, in cross section, an integrated circuit structure and method for fabricating an integrated circuit in accordance with other methods known in the prior art in order to demonstrate certain other problems encountered in the prior art.

While the present disclosure has heretofore been provided in connection with the problems associated with fabricating copper vias, it will be appreciated that the surface modification techniques described herein will have application to other elemental metal-based interconnect fabrication problems encountered in the prior art. For example, as illustrate in FIGS. 14 and 15, another common damascene fabrication problem occurs during the formation of trenches to connect various metal layers. Referring to FIG. 14, a first metal layer (M1) includes an elemental copper interconnect structure 206 formed in a low-k dielectric material layer 208, as that term is understood in the art. A barrier material layer 207, such as a Ta or TaN material, provides a diffusion barrier between the dielectric layer 208 and the elemental copper interconnect structure 206. An elemental metal capping layer 205, such as a cobalt capping layer, is provided over the copper interconnect structure 206, followed by a further dielectric capping layer 202. Thereafter, further integrated circuit structures (not illustrated) may be formed over the M1 layer and electrically isolated by dielectric layer 201, which in turn will have a further metal layer (i.e., M2) formed thereover (not shown). A first hardmask layer 203, formed of TEOS for example, is used to protect areas of the dielectric layer 201 that are not etched. A layer of a second hardmask/barrier material 204, formed of TiN for example, is deposited over the first hardmask layer 203.

Figure 15:
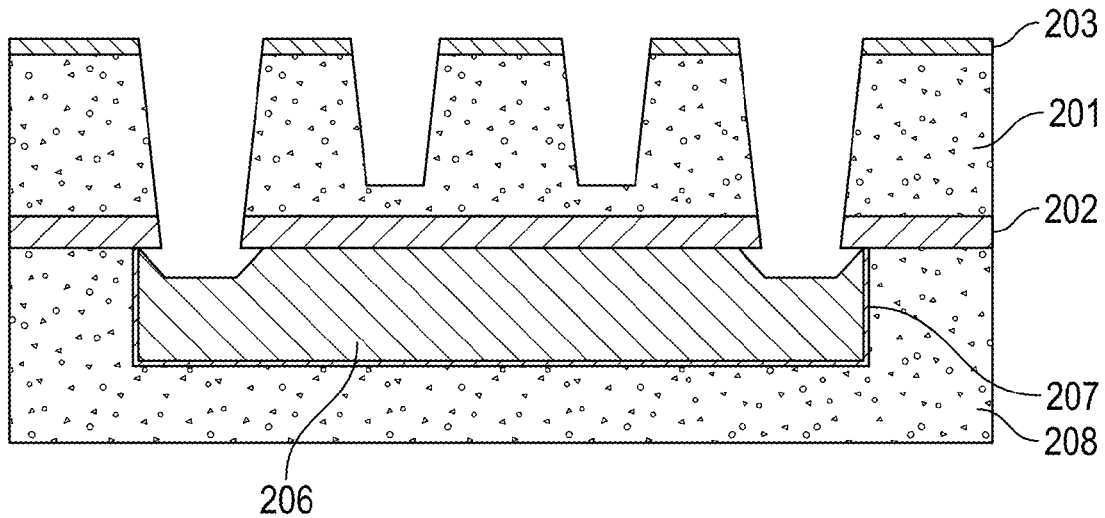

The dielectric material layer 201 and the hardmask material layers 203, 204, have vias trenches 210 formed therein to allow for the formation of electrical connection features therein. The vias 210 may be formed by patterning and etching (for example dry etching) the dielectric layer 201 and the hardmask/barrier material layers 203, 204. After the forming the vias 210, it is typically necessary to wet etch the second hardmask/barrier layer 204 for proper removal of the desired material. Wet etchants that have been developed for TiN typically contain strong oxidizing agents, have a low pH, or both. Cobalt and copper tend to oxidize very rapidly in these polishing compositions. Thus, as shown in FIG. 15, etching of the second hardmask/barrier layer 204 may undesirably result in etching of the capping layer 205 and the M1 interconnect structure 206, leaving "divots" in the interconnect structure that can harm device reliability and performance.

Figure 16:
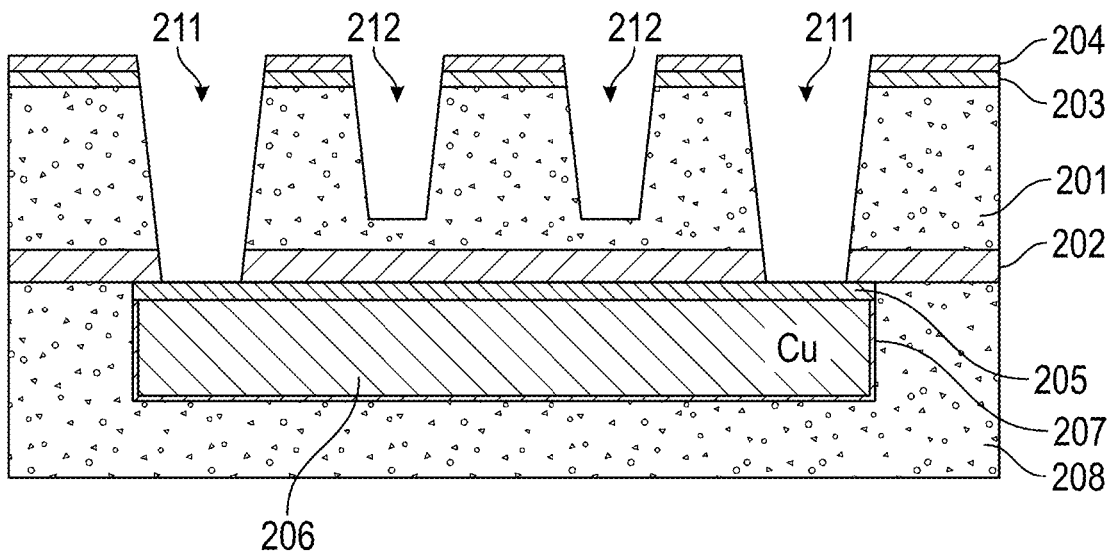
FIGS. 16-18 illustrate, in cross section, an integrated circuit structure and methods for fabricating an integrated circuit in accordance with further embodiments of the present disclosure.
Figure 17:
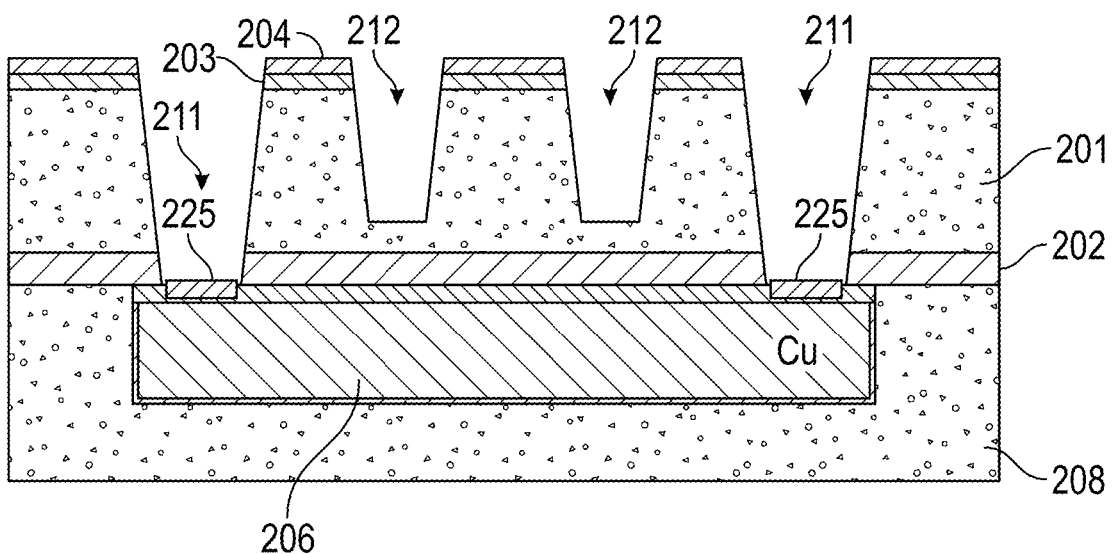
Figure 18:
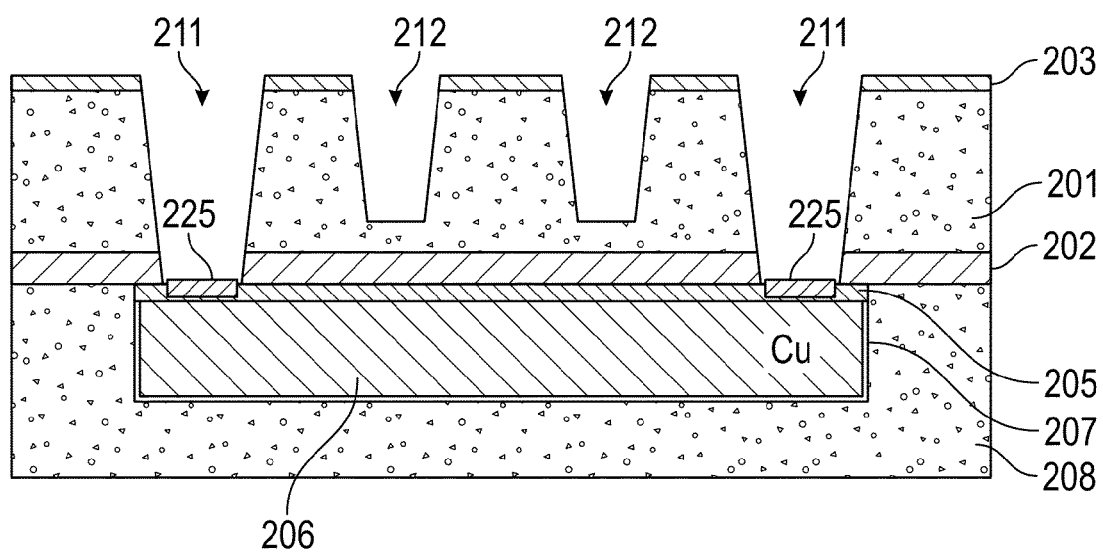

As such, a further embodiment of the present disclosure is provided in connection with FIGS. 16-18. Like the first described embodiment, the exemplary method begins with a step of providing a semiconductor substrate including a first exposed surface including an elemental metal material and a second exposed surface including a barrier material, wherein the elemental metal material has a first etch rate when exposed to a wet etchant and the barrier material has a second etch rate when exposed to the wet etchant. With reference to FIG. 16, illustrated is such a semiconductor substrate. The first exposed surface includes an elemental cobalt material as the capping layer 205 over the interconnect structure 206, and the second exposed surface includes a TiN hardmask/barrier material 204. The device illustrated in FIG. 16 corresponds to the structure described above in connection with FIG. 14, and thus the process details required to fabricate such structure will not be repeated herein.

The exemplary integrated circuit fabrication method continues with a step of modifying the first exposed surface to form a modified first exposed surface so as to reduce the first etch rate when exposed to the wet etchant. As noted above, cobalt tends to be etched using etching chemistries suitable for etching hardmask/barrier materials such as TiN. Thus, in order to slow the etching of the first exposed surface, that of cobalt capping layer 205, the first exposed surface is chemically modified, as indicated by reference numeral 225 in FIG. 17, so as to reduce the etch rate thereof when the wet etchant is applied.

With reference back to FIGS. 8-13, any of the various surface modification methods shown therein are suitable for forming modified first surface 225. The specifics of such surface modification methods were described above in connection with the first embodiment, and as such the details thereof are not repeated herein for brevity (note, though, that the surface modifying compounds bond to a cobalt surface in this embodiment). During subsequent etching processes, when the etchant is applied to the surface 225, the etchant first comes into contact with the surface modifying compound, which reduces the etching rate thereof as compared to the elemental Co metal.

With reference back to FIG. 17, the illustrated cross-section shows the modified first surface 225, which has been modified according to any one of the techniques described above. Thereafter, with reference to FIG. 18, the hardmask/barrier material layer 204 is etched in a wet etching process that employs an etchant that includes a strong oxidizing agent, has a low pH, or both. Suitable etchants for this wet etching step(s) include, for example, NaHClO and NaOH mixture, NH₄OH and hydrogen peroxide, hot H₂SO₄/H₂O₂, or hot HCl/HNO₃. While not intending to be bound by any particular embodiment or mechanism of action, FIG. 18 shows that the modified surface 225 of the cobalt capping layer 205 has inhibited etching of the elemental cobalt material. Beneficially, the divot is prevented from being formed (for example, in contrast to the comparative example of FIG. 15).

Although not illustrated, with regard to any of the embodiments described above, the partially-formed integrated circuit is completed in a conventional manner by, for example, providing electrical contacts to electrical devices, depositing other interlayer dielectrics, etching contact vias, filling the contact vias with conductive plugs, and the like as are well known to those of skill in the art of fabricating integrated circuits. Additional post-processing may include the formation of further metal and interlayer dielectric layers therebetween to complete the various electrical connections in the integrated circuit. The present disclosure is not intended to exclude such further processing steps as are necessary to complete the fabrication of a functional integrated circuit, as are known in the art.

While at least one exemplary embodiment has been presented in the foregoing detailed description of the disclosure, it should be appreciated that a vast number of variations exist. It should also be appreciated that the exemplary embodiment or exemplary embodiments are only examples, and are not intended to limit the scope, applicability, or configuration of the disclosure in any way. Rather, the foregoing detailed description will provide those skilled in the art with a convenient road map for implementing an exemplary embodiment of the disclosure. It being understood that various changes may be made in the function and arrangement of elements described in an exemplary embodiment without departing from the scope of the disclosure as set forth in the appended claims.

What is claimed is:

1. A method for fabricating an integrated circuit comprising:
providing a semiconductor substrate comprising a first exposed surface comprising an elemental metal material and a second exposed surface comprising a barrier material, wherein the elemental metal material has a first etch rate when exposed to a wet etchant and the barrier material has a second etch rate when exposed to the wet etchant;
modifying the first exposed surface to form a modified first exposed surface so as to reduce the first etch rate when exposed to the wet etchant; and
applying the wet etchant simultaneously to the modified first exposed surface and to the second exposed surface.

2. The method of claim 1, wherein providing the semiconductor substrate comprises providing a semiconductor substrate wherein the first exposed surface comprises an elemental copper material.

3. The method of claim 2, wherein providing the semiconductor substrate comprises providing a semiconductor substrate wherein the first exposed surface comprises a portion of a copper interconnect structure.

4. The method of claim 3, wherein providing the semiconductor substrate comprises providing a semiconductor substrate wherein the barrier material comprises a diffusion barrier material.

5. The method of claim 4, wherein providing the semiconductor substrate comprises providing a semiconductor substrate wherein the barrier material comprises a ruthenium material.

6. The method of claim 5, wherein providing the semiconductor substrate comprises providing a semiconductor substrate wherein the barrier material comprises a ruthenium material overlying a tantalum material.

7. The method of claim 6, wherein providing the semiconductor substrate comprises providing a semiconductor substrate wherein the first exposed surface comprises a portion of a cobalt capping layer overlying a copper metal layer.

8. The method of claim 7, wherein providing the semiconductor substrate comprises providing a semiconductor substrate wherein the barrier material comprises a hardmask barrier material.

9. The method of claim 8, wherein the providing the semiconductor substrate comprises providing a semiconductor substrate wherein the barrier material comprises a titanium material.

10. The method of claim 1, wherein providing the semiconductor substrate comprises providing the semiconductor substrate wherein the first and second exposed surfaces are planar with respect to one another.

11. The method of claim 1, wherein modifying the first exposed surface comprises forming a protective surface-modifying protective layer on the first exposed surface.

12. The method of claim 11, wherein modifying the first exposed surface comprises forming a protective copper silicon nitride surface-modifying protective layer on the first exposed surface.

13. The method of claim 11, wherein modifying the first exposed surface comprises forming a methyl silane surface-modifying protective layer on the first exposed surface.

14. The method of claim 11, wherein modifying the first exposed surface comprises forming a metal nitride surface-modifying protective layer on the first exposed surface.

15. The method of claim 11, wherein modifying the first exposed surface comprises forming a thiol surface-modifying protective layer on the first exposed surface.

16. The method of claim 1, wherein modifying the first exposed surface comprises forming a second elemental metal layer on the first exposed surface.

17. The method of claim 16, wherein modifying the first exposed surface comprises forming a manganese elemental metal layer or an aluminum elemental metal layer on the first exposed surface.

18. The method of claim 11, wherein modifying the first exposed surface comprises forming the surface-modifying protective layer on the first exposed surface but not on the second exposed surface.

19. A method for fabricating an integrated circuit comprising:
providing a semiconductor substrate comprising a first exposed surface comprising an elemental copper interconnect structure disposed within a via and a second exposed surface comprising a ruthenium diffusion barrier material, wherein the first exposed surface and the second exposed surface are planar with respect to one another, and wherein the elemental copper interconnect structure has a first etch rate when exposed to a wet etchant and the ruthenium diffusion barrier material has a second etch rate that is slower than the first etch rate when exposed to the wet etchant;
modifying the first exposed surface to form a modified first exposed surface so as to reduce the first etch rate when exposed to the wet etchant, wherein modifying the first exposed surface is selected from the group consisting of: forming a protective copper silicon nitride surface-modifying protective layer on the first exposed surface, forming a methyl silane surface-modifying protective layer on the first exposed surface, forming a metal nitride surface-modifying protective layer on the first exposed surface, forming a thiol surface-modifying protective layer on the first exposed surface, and forming a second elemental metal layer on the first exposed surface; and applying the wet etchant simultaneously to the modified first exposed surface and to the second exposed surface.

20. A method for fabricating an integrated circuit comprising:

providing a semiconductor substrate comprising a first exposed surface comprising an elemental cobalt capping layer disposed over a copper metal layer and a second exposed surface comprising a titanium hardmask barrier material, wherein the first exposed surface and the second exposed surface are non-planar with respect to one another, and wherein the elemental cobalt capping layer has a first etch rate when exposed to a wet etchant and the titanium hardmask barrier material has a second etch rate when exposed to the wet etchant;

modifying the first exposed surface to form a modified first exposed surface so as to reduce the first etch rate when exposed to the wet etchant, wherein modifying the first exposed surface is selected from the group consisting of: forming a protective copper silicon nitride surface-modifying protective layer on the first exposed surface, forming a methyl silane surface-modifying protective layer on the first exposed surface, forming a metal nitride surface-modifying protective layer on the first exposed surface, forming a thiol surface-modifying protective layer on the first exposed surface, and forming a second elemental metal layer on the first exposed surface; and applying the wet etchant simultaneously to the modified first exposed surface and to the second exposed surface.

* * * * *